US008866176B2

(12) United States Patent
Hirakata et al.

(10) Patent No.: US 8,866,176 B2
(45) Date of Patent: Oct. 21, 2014

(54) DISPLAY DEVICE

(71) Applicant: Semiconductor Energy Laboratory Co., Ltd., Kanagawa-ken (JP)

(72) Inventors: Yoshiharu Hirakata, Kanagawa (JP); Shunpei Yamazaki, Tokyo (JP); Hideaki Kuwabara, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 13/887,831

(22) Filed: May 6, 2013

(65) Prior Publication Data

US 2013/0299791 A1    Nov. 14, 2013

(30) Foreign Application Priority Data

May 10, 2012   (JP) .................. 2012-108940

(51) Int. Cl.
*H01L 21/00*        (2006.01)
(52) U.S. Cl.
USPC .................. 257/98; 257/40; 257/84; 257/87; 257/E29.333
(58) Field of Classification Search
USPC ........ 257/40, 59, 83, 88–89, 98–100; 438/22, 438/48–52; 313/501, 503–507
See application file for complete search history.

(56) References Cited

U.S. PATENT DOCUMENTS

| 6,037,712 | A  | 3/2000  | Codama et al. |
| 6,127,199 | A  | 10/2000 | Inoue et al. |
| 6,372,608 | B1 | 4/2002  | Shimoda et al. |
| 6,429,584 | B2 | 8/2002  | Kubota |
| 6,645,830 | B2 | 11/2003 | Shimoda et al. |
| 6,781,162 | B2 | 8/2004  | Yamazaki et al. |
| 6,818,530 | B2 | 11/2004 | Shimoda et al. |
| 6,828,727 | B2 | 12/2004 | Yamazaki |
| 7,161,184 | B2 | 1/2007  | Miyagi et al. |
| 7,482,182 | B2 * | 1/2009  | Yamazaki et al. .............. 438/22 |
| 7,633,218 | B2 | 12/2009 | Cok |
| 7,633,223 | B2 | 12/2009 | Yamazaki |
| 7,674,650 | B2 | 3/2010  | Akimoto et al. |
| 7,753,751 | B2 | 7/2010  | Yamazaki |
| 7,834,543 | B2 | 11/2010 | Takata |
| 7,888,864 | B2 | 2/2011  | Young |
| 7,897,979 | B2 * | 3/2011  | Yamazaki et al. .............. 257/83 |
| 7,943,938 | B2 | 5/2011  | Miyagi et al. |
| 7,952,103 | B2 | 5/2011  | Yamazaki et al. |

(Continued)

FOREIGN PATENT DOCUMENTS

| JP | 10-125931   | 5/1998 |
| JP | 2003-288994 | 10/2003 |

(Continued)

*Primary Examiner* — Dung A. Le
(74) *Attorney, Agent, or Firm* — Husch Blackwell LLP (57) ABSTRACT

A structure of an EL display device which has an increased display area is provided. Further, a structure of an EL display device which has a high definition display is provided. An auxiliary electrode is formed over a first partition and side surfaces of the auxiliary electrode are covered with a second partition. A top surface of the auxiliary electrode is in contact with the conductive film which is one electrode of a light-emitting element and has a light-transmitting property, which enables a large-area display. Further, even the distance between the adjacent light-emitting elements is shortened, the auxiliary electrode can be provided between the adjacent light-emitting elements, which enables a high definition display.

19 Claims, 4 Drawing Sheets

(56) References Cited

U.S. PATENT DOCUMENTS

| | | |
|---|---|---|
| 7,999,463 B2 | 8/2011 | Nomura |
| 8,344,363 B2 * | 1/2013 | Yamazaki et al. ............... 257/40 |
| 8,415,208 B2 | 4/2013 | Takayama et al. |
| 8,624,235 B2 * | 1/2014 | Yamazaki et al. ............... 257/40 |
| 2001/0054867 A1 | 12/2001 | Kubota |
| 2003/0032210 A1 | 2/2003 | Takayama et al. |
| 2003/0060055 A1 | 3/2003 | Kamijima |
| 2008/0018229 A1 | 1/2008 | Yamazaki |
| 2009/0009069 A1 | 1/2009 | Takata |
| 2009/0239320 A1 | 9/2009 | Takayama et al. |
| 2010/0096633 A1 | 4/2010 | Hatano et al. |
| 2010/0105275 A1 | 4/2010 | Kubota |
| 2010/0176720 A1 | 7/2010 | Yamazaki et al. |
| 2011/0089814 A1 | 4/2011 | Nomura |
| 2011/0089823 A1 | 4/2011 | Nomura |
| 2011/0101388 A1 | 5/2011 | Nomura |
| 2011/0140617 A1 | 6/2011 | Nomura |
| 2011/0210335 A1 | 9/2011 | Miyagi et al. |
| 2012/0205678 A1 | 8/2012 | Ikeda et al. |
| 2012/0205700 A1 | 8/2012 | Tanada et al. |
| 2012/0217516 A1 | 8/2012 | Hatano et al. |

FOREIGN PATENT DOCUMENTS

| | | |
|---|---|---|
| JP | 2005-235491 | 9/2005 |
| JP | 2007-95611 | 4/2007 |
| JP | 2007-96055 | 4/2007 |
| JP | 2007-123861 | 5/2007 |
| JP | 2008-112656 | 5/2008 |
| JP | 2008-135325 | 6/2008 |
| JP | 2009-130132 | 6/2009 |
| JP | 2009-266803 | 11/2009 |

* cited by examiner

DISPLAY DEVICE

BACKGROUND OF THE INVENTION

1. Field of the Invention

The present invention relates to a display device, a method for manufacturing the display device, and an electronic appliance including the display device.

In this specification, a semiconductor device generally means a device which can function by utilizing semiconductor characteristics, and an electrooptic device, a semiconductor circuit, and an electronic appliance are all semiconductor devices.

2. Description of the Related Art

A transistor formed over a glass substrate or the like includes amorphous silicon, polycrystalline silicon, or the like, as typically seen in a liquid crystal display device or an EL display device. Although a transistor using amorphous silicon has low field effect mobility, it can be formed over a larger glass substrate. On the other hand, although a transistor using polycrystalline silicon has high field effect mobility, it is not suitable for being formed over a larger glass substrate.

In contrast to a transistor using silicon, attention has been focused on a technique of manufacturing a transistor using an oxide semiconductor and applying such a transistor to an electronic appliance or an optical device. For example, a technique of manufacturing a transistor using zinc oxide or In—Ga—Zn—O-based oxide as an oxide semiconductor, and using such a transistor for a switching element of a pixel in a display device and the like is disclosed in Patent Document 1 and Patent Document 2.

Further, display devices with large display areas have increasingly become popular. Televisions with display screens having a diagonal of 40 inches to 50 inches are becoming common as home televisions and are expected to become more popular in the future. As described above, the field effect mobility of the transistor using an oxide semiconductor is ten or more times as high as that of the transistor using amorphous silicon; therefore, the performance of the transistor using an oxide semiconductor is high enough to allow the use of the transistor as a switching element of a pixel in a display device having a large display area.

Furthermore, when the display devices with large display areas are manufactured, there is a significant problem of signal delay due to resistance of a signal line. For this reason, a material with a low electric resistance value is used for a material of the signal line. In addition, a structure in which an auxiliary electrode is provided in a pixel portion is disclosed in Patent Document 3.

REFERENCE

[Patent Document 1] Japanese Published Patent Application No. 2007-123861
[Patent Document 2] Japanese Published Patent Application No. 2007-096055
[Patent Document 3] Japanese Published Patent Application No. 2003-288994

SUMMARY OF THE INVENTION

Further, an increase not only in an area but also in definition of displays in the display devices has been demanded. For example, ultra high-definition display devices with a large number of pixels, such as a full high definition (FHD) display, a 4k2k display, and an 8k4k display, have been developed. As the size and definition of display devices are increased, the number of signal lines for inputting signals to pixels is increased with an increase in the number of pixels.

EL display devices are broadly divided into top emission display devices and bottom emission display devices. The top emission display devices are suitable to increase definition because of having a higher aperture ratio than the bottom emission display devices. A top emission EL display device has a structure in which a layer containing an organic compound is formed over a first electrode electrically connected to a transistor formed over a substrate, a second electrode having a light-transmitting property is provided over the layer containing an organic compound, and light emitted passes through the second electrode.

As a material for the second electrode having a light-transmitting property, a material called a conductive film having a light-transmitting property (typically, indium tin oxide (ITO), indium zinc oxide, or the like) is used. However, with the use of the material, film resistance is easily increased and a nonuniform potential distribution occurs due to a voltage drop, which might cause malfunctions such as a variation in luminance of a light-emitting element.

In view of the above, a structure of an EL display device which has an increased display area is provided. Further, a structure of an EL display device which has a high definition display.

Thus, an auxiliary electrode is provided in contact with the conductive film having a light-transmitting property to enable an increase in a display area. Further, color filters overlap with a plurality of white light-emitting elements arranged in a pixel portion to enable a high definition display.

As the color filters, a red coloring layer is provided to face a red light-emitting region (R), a green coloring layer is provided to face a green light-emitting region (G), and a blue coloring layer is provided to face a blue light-emitting region (B). The white light-emitting element overlaps with the red coloring layer in the red light-emitting region (R), light emitted from the white light-emitting element is extracted through the red coloring layer, and thus red light is provided. A black portion of the color filters, i.e., a light-shielding film (also referred to as black matrix), blocks light in regions other than the light-emitting regions. Note that the light-shielding film is formed of a metal film (e.g., chromium) or an organic film containing a black pigment.

Note that the auxiliary electrode is formed over a first partition provided between the adjacent first electrodes. The angle between a side surface of the first partition and a top surface of the substrate, i.e., a taper angle, is less than 90°. A second partition is provided in contact with a top surface and side surfaces of the auxiliary electrode, and the layer containing an organic compound is divided owing to a step height between the first partition and the second partition.

The second partition is formed over the first partition together with the auxiliary electrode and covers at least the side surfaces of the auxiliary electrode, and the layer containing an organic compound is not formed on side surfaces of the second partition when the second partition is seen in a cross section. For example, the angle between the side surface of the second partition and the top surface of the substrate is more than or equal to 90° and less than or equal to 135°.

The second partition has the side surfaces on which the layer containing an organic compound is not formed when seen in the cross section, whereby a first layer containing an organic compound is formed on the first partition so that an edge thereof is in contact with the first partition, a second layer containing an organic compound is formed on and in contact with the second partition, and top edges of the second partition are substantially aligned with edges of the second layer containing an organic compound; thus, the edge of the first layer containing an organic compound is divided from the edge of the second layer containing an organic compound.

The first partition is formed of an insulating material and formed to cover the periphery of an edge of the first electrode, and a region where the first electrode is not covered with the first partition serves as the light-emitting region.

For the auxiliary electrode, a film or a laminated film including an element selected from Ag, Cu, Mg, and Mo, an alloy material containing such an element as its main component, or a compound material containing such an element as its main component is formed by sputtering, evaporation, or the like. In the case of forming the auxiliary electrode by evaporation, an evaporation mask is used so that the auxiliary electrode has a top surface with a desired shape. In the case of forming the auxiliary electrode by sputtering, photolithography is used to form a resist mask and etching is performed so that the auxiliary electrode has a top surface with a desired shape.

A display device of the present invention disclosed in this specification includes a transistor over a substrate having an insulating surface; a first electrode electrically connected to the transistor; a first partition covering the periphery of an edge of the first electrode; a layer containing an organic compound over the first electrode; a second electrode having a light-transmitting property over the layer containing an organic compound; a third electrode that is an auxiliary electrode over the first partition; and a second partition covering side surfaces of the third electrode over the first partition. The second partition has an opening reaching the third electrode and the third electrode is electrically connected to the second electrode through the opening.

In the above structure, the second electrode is formed over the first partition and between an edge of the layer containing an organic compound and the second partition, so that the second electrode is in contact with the first partition.

As the second electrode having a light-transmitting property, a MgAg film having a thickness less than or equal to 20 nm, preferably more than or equal to 15 nm and less than or equal to 20 nm is used. As long as the second electrode has a thickness less than or equal to 20 nm, the second electrode has a property of transmitting light emitted from the layer containing an organic compound. Further, the MgAg film over which indium tin oxide (ITO), indium zinc oxide, or the like is stacked may be used as the second electrode.

In the above structure, the auxiliary electrode preferably has a thickness at least larger than that of the second electrode. In addition, in the above structure, the same material can be used for the auxiliary electrode and the second electrode. For example, it is preferable that a MgAg film having a large thickness be used as the auxiliary electrode and a MgAg film having a small thickness be used as the second electrode, in which case contact resistance can be reduced because the same material is used.

In the above structure, a coloring layer is further provided over the first electrode to enable a full-color display. In the above structure, it is preferable that a light-shielding film functioning as a black matrix be further provided over the second partition. The coloring layer and the black matrix are provided over a substrate which is different from the substrate provided with the transistor and which is used for sealing the light-emitting element. Since the display device with the above structure is a top emission display device, a substrate having a property of transmitting light from the light-emitting element is used as the substrate provided with the coloring layer and the black matrix.

In the above structure, an oxide semiconductor material is used for a semiconductor layer of the transistor. The field-effect mobility of a transistor using the oxide semiconductor material is ten or more times as large as that of a transistor using amorphous silicon. Therefore, the transistor using the oxide semiconductor material can provide a performance high enough to allow the use of the transistor as a pixel switching element even in a large-sized display device. The field effect mobility of the transistor using amorphous silicon is approximately 0.5 $cm^2/Vs$ in general, whereas the field effect mobility of the transistor using the oxide semiconductor material is 10 $cm^2/Vs$ to 20 $cm^2/Vs$ or higher than or equal to 20 $cm^2/Vs$. Further, an active layer using an oxide semiconductor material can be formed by sputtering or the like; thus, the transistor using the oxide semiconductor material can be easily manufactured without using a laser device, which is used in manufacture of a transistor using polycrystalline silicon. Furthermore, the transistor using the oxide semiconductor material can be manufactured on an existing production line of transistors using amorphous silicon by just changing part of the line; thus, additional spending on equipment can be minimized to reduce the manufacturing cost of the transistor.

An oxide semiconductor containing at least In is used for the oxide semiconductor material. Examples of the oxide semiconductor material include indium oxide; two-component metal oxides such as an In—Zn-based oxide, an In—Mg-based oxide, and an In—Ga-based oxide; three-component metal oxides such as an In—Ga—Zn-based oxide (also referred to as IGZO), an In—Al—Zn-based oxide, an In—Sn—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, and an In—Lu—Zn-based oxide; four-component metal oxides such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, and an In—Hf—Al—Zn-based oxide; and the like.

Note that here, for example, an In—Ga—Zn-based oxide means an oxide containing In, Ga, and Zn, and there is no limitation on the composition ratio of In, Ga, and Zn. Further, the In—Ga—Zn-based oxide may contain a metal element other than In, Ga, and Zn.

Further, in the above structure, a single crystal film, a polycrystalline film, a microcrystalline film, or a c-axis aligned crystalline oxide semiconductor (CAAC-OS) film is used for the semiconductor layer of the transistor.

The CAAC-OS film is not completely single crystal nor completely amorphous. The CAAC-OS film is an oxide semiconductor film including a crystal component. Note that in most cases, the crystal component fits inside a cube whose one side is less than 100 nm. In an image obtained with a transmission electron microscope (TEM), a grain boundary in the CAAC-OS film is not clearly found. Therefore, in the CAAC-OS film, a reduction in electron mobility, due to the grain boundary, is suppressed.

In the crystal component included in the CAAC-OS film, a c-axis is aligned in a direction parallel to a normal vector of a surface where the CAAC-OS film is formed or a normal vector of a surface of the CAAC-OS film, triangular or hexagonal atomic arrangement which is seen from the direction perpendicular to the a-b plane is formed, and metal atoms are arranged in a layered manner or metal atoms and oxygen atoms are arranged in a layered manner when seen from the direction perpendicular to the c-axis. Note that, among crystal components, the directions of the a-axis and the b-axis of one crystal component may be different from those of another crystal component. In other words, because the a-axis and the b-axis vary among the crystal components in the CAAC-OS film although the c-axes are aligned, the CAAC-OS film is not an epitaxially grown film. In this specification, a simple term "perpendicular" includes a range from 85° to 95°. In addition, a simple term "parallel" includes a range from −5° to 5°.

The oxide semiconductor film can be formed to have a thickness more than or equal to 1 nm and less than or equal to 30 nm (preferably more than or equal to 5 nm and less than or equal to 10 nm) by sputtering, molecular beam epitaxy (MBE), CVD, pulsed laser deposition, atomic layer deposition (ALD), or the like as appropriate. In addition, the oxide semiconductor film may be formed with the use of a sputtering apparatus in which deposition is performed in a state where surfaces of a plurality of substrates are set substantially perpendicularly to a surface of a sputtering target.

The single crystal film, the polycrystalline film, the microcrystalline film, or the CAAC-OS film can be obtained by changing in deposition conditions of a deposition method, increasing the substrate temperature at the time of deposition, or performing heat treatment after the deposition as appropriate.

Furthermore, in the above structure, a fourth electrode formed of the same material as the first electrode of the light-emitting element is further included. The fourth electrode is electrically connected to a terminal electrode. The auxiliary electrode is provided on and in contact with the fourth electrode. The second electrode of the light-emitting element is provided on and in contact with the fourth electrode. That is to say, in the display device, the auxiliary electrode is connected to a wiring in a lower layer at a portion different from a portion where the auxiliary electrode is connected to a wiring in an upper layer. Specifically, in the pixel portion, to improve an aperture ratio, the auxiliary electrode is preferably in contact with the second electrode formed thereover to be electrically connected to the second electrode; in a region outside the pixel portion, to enable an electrical connection in a large area so that electrical conduction is ensured, the fourth electrode is preferably provided with the use of the same mask as the first electrode.

An oxide semiconductor material is used for a semiconductor layer of a transistor and an auxiliary electrode is provided between adjacent light-emitting elements to enable a large-area display. Further, in a top-emission EL display device, even the distance between the adjacent light-emitting elements is shortened, the auxiliary electrode can be provided between the adjacent light-emitting elements, which also enables a high definition display.

DETAILED DESCRIPTION OF THE INVENTION

Embodiments of the present invention are described below in detail with reference to the accompanying drawings. However, the present invention is not limited to the description below, and it is easily understood by those skilled in the art that modes and details disclosed herein can be modified in various ways without departing from the spirit and the scope of the present invention. Further, the present invention is not construed as being limited to description of the embodiments.

Embodiment 1

In this embodiment, a structure of a display device which is one embodiment of the present invention is described with reference to FIGS. 1A and 1B, FIGS. 2A and 2B, and FIGS. 3A and 3B.

Figure 2A:
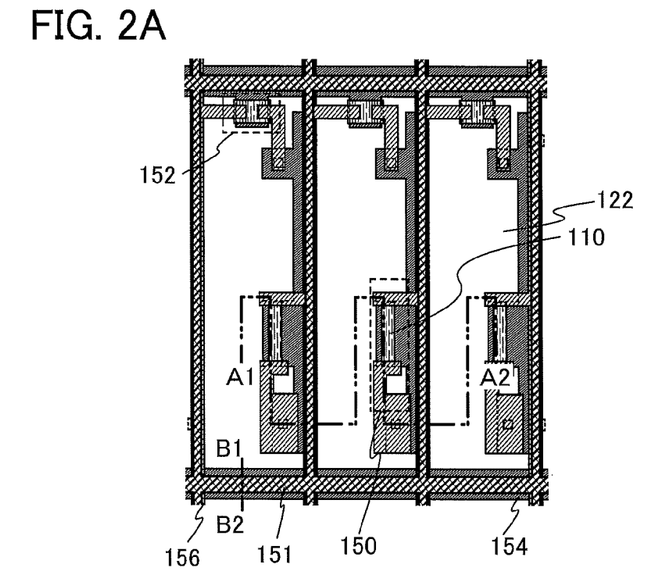
FIGS. 2A and 2B are top views of one embodiment of the present invention.
Figure 2B:
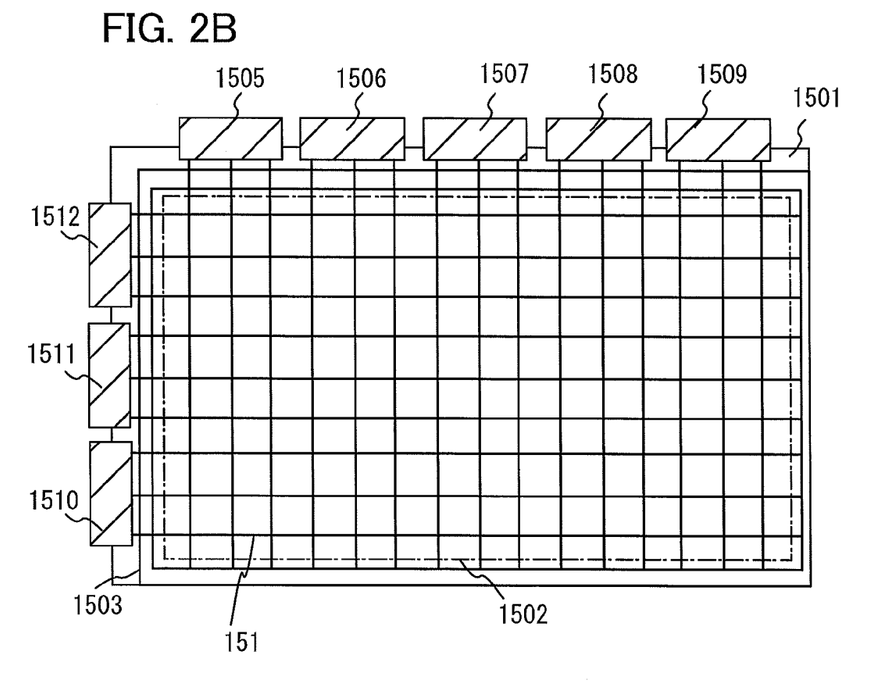

FIG. 2B is a general schematic view of the display device. The display device in FIG. 2B includes a pixel portion 1502 including a plurality of light-emitting elements over a substrate 1501 having an insulating surface. A sealing substrate 1503 including a color filter and the substrate 1501 are fixed so that the color filter overlaps with the pixel portion 1502. Terminals connected to the outside of the display device are connected to FPCs 1505, 1506, 1507, 1508, 1509, 1510, 1511, and 1512. Note that the sealing substrate 1503 does not overlap with the terminals connected to the FPCs. FIG. 2B illustrates an example of providing an auxiliary electrode 151 with a net-like shape. The potential of the auxiliary electrode 151 is set to a fixed potential or a ground potential through the FPCs.

Although FIG. 2B illustrates an example where the auxiliary electrode is formed to surround a plurality of pixels, i.e., the plurality of light-emitting elements, the auxiliary electrode 151 may be provided to surround each of the light-emitting elements as illustrated in FIG. 2A.

Figure 1A:
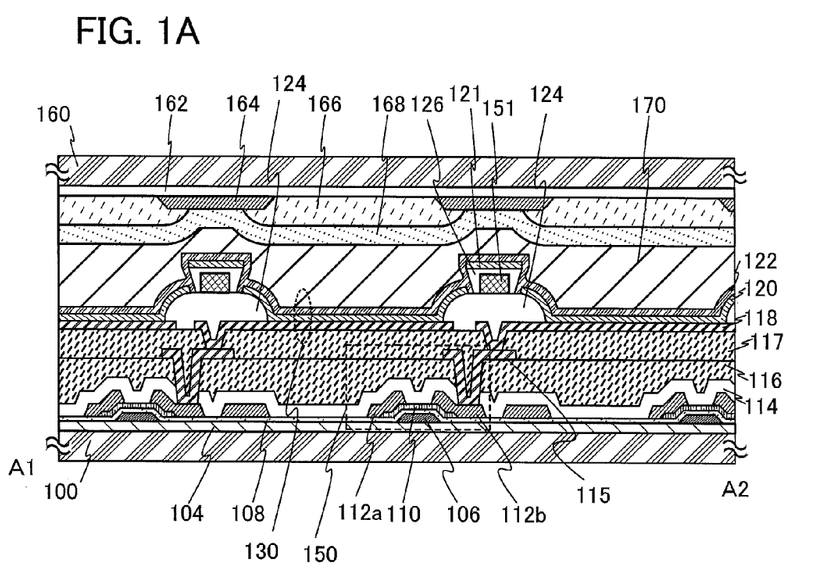
FIGS. 1A and 1B are cross-sectional views of one embodiment of the present invention.
Figure 1B:
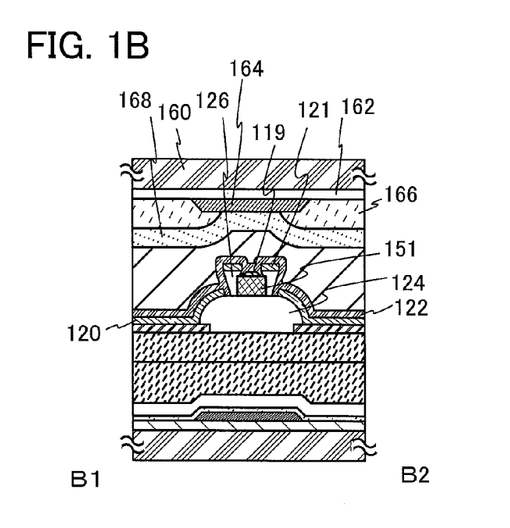

FIG. 2A is a top view of a first substrate 100 seen from the side of a second electrode 122, which illustrates part of the pixel of the display device. FIG. 1A is a cross-sectional view taken along the dashed line A1-A2 in FIG. 2A. FIG. 1B corresponds to a cross-sectional view taken along the dashed line B1-B2 in FIG. 2A.

In the top view of FIG. 2A, some components (e.g., first partitions 124 and second partitions 126) of the display device are omitted for simplicity. The auxiliary electrode 151 is formed over the first partitions 124 and is not electrically connected to source wirings 156 and gate wirings 154. Note that the angle between a side surface of the first partition 124 and a top surface of the substrate 100, i.e., the taper angle, is less than 90°. It is preferable that the first partition 124 have a forward tapered shape so that a film formed over the first partition 124 is prevented from being cut.

In the display device illustrated in FIG. 2A, the source wirings 156 are provided parallel to (extending in the vertical direction in the drawing) and apart from each other, and the gate wirings 154 are provided parallel to (extending in the horizontal direction in the drawing) and apart from each other. A substantially rectangular region is surrounded by the source wirings 156 and the gate wirings 154. This region serves as one pixel of the display device, and a plurality of pixels is arranged in matrix. In addition, the auxiliary electrode 151 is provided to surround the substantially rectangular region.

Further, a transistor 150 which controls driving of a light-emitting element 130 and a transistor 152 which selects an intended pixel are formed in each pixel. Note that the display device is a top-emission display device in which a plurality of transistors can be arranged without reducing the area of a light-emitting region; therefore, the number of transistors arranged in one pixel is not limited, and two or more transistors, e.g., five transistors may be arranged. In addition, the second partition 126 is provided between the adjacent pixels. The second partition 126 may be provided between every pair of adjacent pixels or provided at regular intervals.

Note that the angle between a side surface of the second partition 126 and the top surface of the substrate 100 is more than or equal to 90° and less than or equal to 135°.

Although a top surface and side surfaces of the auxiliary electrode 151 are covered with the second partition 126 and the auxiliary electrode 151 is not in contact with the second electrode 122 in FIG. 1A, the auxiliary electrode 151 and the second electrode 122 are electrically connected to each other through an opening which is formed in the second partition 126 and reaches the auxiliary electrode 151 as illustrated in FIG. 1B, and the auxiliary electrode 151 and the second electrode 122 have the same potential.

FIG. 1B illustrates a portion where the auxiliary electrode 151 and the second electrode 122 are connected to each other. In a region where a layer 119 containing an organic compound and formed on and in contact with the auxiliary electrode 151 is not provided in the opening formed in the second partition 126, the second electrode 122 is provided on and in contact with the auxiliary electrode 151. In addition, a layer 121 containing an organic compound is provided over the second partition 126. The layer 119 containing an organic compound over the auxiliary electrode 151 is divided from the layer 121 containing an organic compound over the second partition 126 by the second partition 126 and is also divided from a layer 120 containing an organic compound over a first electrode 118 by the second partition 126. Note that the second partition 126 divides the layer 121 containing an organic compound over the second partition 126 and the layer 120 containing an organic compound over the first electrode 118 from each other.

The layer 119 containing an organic compound over the auxiliary electrode 151, the layer 120 containing an organic compound over the first electrode 118, and the layer 121 containing an organic compound over the second partition 126 are formed at the same time and are divided from each other with the second partition 126.

In addition, the second electrode 122 is also formed in contact with the side surfaces of the second partition 126 and the top surface of the first partition. In the case where the angle between the side surface of the second partition 126 and the top surface of the substrate 100 is more than 135° or in the case where the second partition 126 has a large thickness, the second electrode 122 might not be formed on the side surfaces of the second partition 126.

The display device illustrated in FIG. 1A includes a first buffer layer 104 provided over the first substrate 100, the transistor 150 which controls the driving of the light-emitting element and is provided over the first buffer layer 104, the light-emitting element 130 electrically connected to the transistor 150, the first partitions 124 surrounding a light-emitting region of the light-emitting element 130, the auxiliary electrode 151 formed over the first partitions 124, and the second partitions 126 formed over the auxiliary electrode 151 and the first partitions 124. In the display device illustrated in FIG. 1A, a second substrate 160 is provided with light-shielding films 164 and coloring layers 166, and the second substrate 160 and the first substrate 100 are bonded to each other with a first adhesive layer 170 and a second adhesive layer. Although not illustrated, the second adhesive layer has a closed-loop shape surrounding the pixel portion and is in contact with side surfaces of the first adhesive layer when seen from the above.

The transistor 150 includes a gate electrode 106 formed over the first buffer layer 104, a gate insulating layer 108 formed over the gate electrode 106, a semiconductor layer 110 formed over the gate insulating layer 108, and a source electrode 112a and a drain electrode 112b formed over the semiconductor layer 110. The transistor 150 is covered with a first insulating layer 114, a second insulating layer 116, and a third insulating layer 117. In the transistor 150, a connection electrode 115 electrically connected to the drain electrode 112b through an opening formed in the first insulating layer 114 and the second insulating layer 116 is fanned; the connection electrode 115 is electrically connected to the first electrode 118 over the third insulating layer 117 through an opening formed in the third insulating layer 117. The first electrode 118, the layer 120 containing an organic compound and formed over the first electrode 118, and the second electrode 122 and formed over the layer 120 containing an organic compound are provided over the third insulating layer 117.

Further, the display device illustrated in FIG. 1A is a top-emission display device in which light from the light-emitting element 130 is emitted from the second substrate 160 side through the coloring layer 166. Therefore, a substrate having a light-transmitting property, such as a glass substrate or a plastic substrate, is used as the second substrate 160.

Although not illustrated in FIG. 1A, the transistor 152 illustrated in FIG. 2A has the same structure as the transistor 150. However, the size (e.g., channel length and channel width) of each transistor and a connection and the like of the transistors can be adjusted as appropriate by practitioners.

Here, an example of a method for manufacturing the transistor is described below.

First, the first buffer layer 104 is formed over the first substrate. A single layer or stacked layers of silicon nitride, silicon oxynitride, silicon nitride oxide, or the like is preferably formed as the first buffer layer 104. The first buffer layer 104 is not necessarily provided if it is not needed.

Next, a conductive film is formed over the first buffer layer 104, and a photolithography process and an etching step are performed thereon, so that the gate electrode 106 is formed.

The gate electrode 106 can be formed using a single layer or stacked layers of a metal material such as molybdenum, titanium, chromium, tantalum, tungsten, aluminum, copper, neodymium, or scandium, or an alloy material which contains any of these elements.

Next, the gate insulating layer 108 is formed over the gate electrode 106. As the gate insulating layer 108, a single layer or stacked layers of silicon oxide, silicon nitride, silicon oxynitride, silicon nitride oxide, or aluminum oxide can be formed by plasma CVD, sputtering, or the like.

Next, a semiconductor layer is formed, and a photolithography process and an etching step are performed thereon, so that the semiconductor layer 110 with an island shape is formed.

An oxide semiconductor material is used to form a material of the semiconductor layer 110. As the oxide semiconductor material, an In—Ga—Zn—O-based metal oxide or the like can be used as appropriate. Note that as the semiconductor layer 110, an oxide semiconductor material which is an In—Ga—Zn—O-based metal oxide is preferably used, in which case the semiconductor layer 110 has low off-state current to allow a reduction in an off-state leakage current of the light-emitting element formed later.

Next, a conductive film is formed over the gate insulating layer 108 and the semiconductor layer 110, and a photolithography process and an etching step are performed thereon, whereby the source electrode 112a and the drain electrode 112b are formed.

As the conductive film used for the source electrode 112a and the drain electrode 112b, for example, a metal film containing an element selected from Al, Cr, Cu, Ta, Ti, Mo, and W, a metal nitride film containing any of these elements (a titanium nitride film, a molybdenum nitride film, or a tungsten nitride film), or the like can be used.

Next, the first insulating layer 114 is formed over the semiconductor layer 110, the source electrode 112a, and the drain electrode 112b. As the first insulating layer 114, an inorganic insulating film such as a silicon oxide film, a silicon oxynitride film, or an aluminum oxide film can be used.

Next, the second insulating layer 116 is formed over the first insulating layer 114.

As the second insulating layer 116, an insulating film with a planarization function is preferably selected to reduce surface unevenness due to the transistor. For example, an organic material such as a polyimide resin, an acrylic resin, or a benzocyclobutene resin can be used. Other than such organic materials, it is also possible to use a low-dielectric constant material (a low-k material) or the like.

Next, the opening reaching the drain electrode 112b is formed in the first insulating layer 114 and the second insulating layer 116 by a photolithography process and an etching step. As a method for forming the opening, dry etching, wet etching, or the like may be selected as appropriate.

Then, a conductive film is formed over the second insulating layer 116 and the drain electrode 112b, and a photolithography process and an etching step are performed thereon, whereby the connection electrode 115 is formed. Through the above-described steps, the transistor 150 can be manufactured. The transistor 150 is an n-channel transistor.

An example of a method for forming the light-emitting element 130 connected to the transistor 150 is described below.

The third insulating layer 117 is formed over the second insulating layer 116. For the third insulating layer 117, a material which is the same as that of the second insulating layer 116 can be used, and an insulating film with a planarization function is preferably selected to reduce surface unevenness due to the transistor.

Next, the opening reaching the connection electrode 115 is formed in the third insulating layer 117 by a photolithography process and an etching step.

Then, a conductive film is formed over the third insulating layer 117 and the connection electrode 115, and a photolithography process and an etching step are performed thereon, whereby the first electrode 118 is formed.

For the first electrode 118, a material which efficiently reflects light emitted from the layer 120 containing an organic compound (which is formed later) and functioning as a light-emitting layer is preferably used, in which case the light-extraction efficiency can be improved. Note that the first electrode 118 may have a stacked-layer structure. For example, a conductive film of metal oxide, a titanium film, or the like is formed to have a small thickness on a side in contact with the layer 120 containing an organic compound, and a metal film (aluminum, an alloy containing aluminum, silver, or the like) having high reflectance can be used on the other side. With such a structure, formation of an insulating film between the layer 120 containing an organic compound and the metal film (aluminum, an alloy containing aluminum, silver, or the like) having high reflectance can be suppressed, which is preferable. In this embodiment, the first electrode 118 has a three-layer structure in which a 50-nm-thick titanium film, a 200-nm-thick aluminum film, and an 8-nm-thick titanium film are stacked in this order.

Next, the first partition 124 is formed over the first electrode 118.

An organic insulating material or an inorganic insulating material is used to form the first partition 124. It is particularly preferable that the first partition 124 be formed using a photosensitive resin material and be formed to have a sidewall having an inclined surface with continuous curvature.

Next, a conductive film is formed over the first partition 124, and a photolithography process and an etching step are performed thereon, so that the auxiliary electrode 151 is formed. For the auxiliary electrode 151, a film or a laminated film including an element selected from Ag, Cu, Mg, and Mo, an alloy material containing such an element as its main component, or a compound material containing such an element as its main component is formed by sputtering, evaporation, or the like. In the case of performing a photolithography process and an etching step, etching conditions and a material are selected so that the first electrode 118 remains. In this embodiment, evaporation is performed with the use of an evaporation mask to selectively form a MgAg film over the first partition 124, whereby the auxiliary electrode 151 is formed.

Next, the second partition 126 is formed over the first partition 124. Note that the second partition 126 has a thickness larger than that of the auxiliary electrode 151.

The shape of the second partition 126 is important because the second partition 126 needs to divide a layer containing an organic compound and formed later. The second partition 126 has a cross-sectional shape with which the angle between the side surface of the second partition 126 and the top surface of the first substrate 100 is more than or equal to 90° and less than or equal to 135°. For example, the second partition 126 described in this embodiment has a reverse tapered shape. Here, the reverse tapered shape refers to a shape whose side portion or top portion extends outside the bottom portion in a direction parallel to the substrate.

An inorganic insulating material or an organic insulating material can be used to form the second partition 126. As the organic insulating material, for example, a negative or positive type photosensitive resin material, a non-photosensitive resin material, or the like can be used.

The opening reaching the auxiliary electrode 151 is formed when the second partition 126 is formed or after the second partition 126 is formed. This opening is necessary to electrically connect the auxiliary electrode 151 and the second electrode formed later. In this embodiment, the negative type photosensitive resin material is used. Having higher definition than the positive type photosensitive resin material, the negative type photosensitive resin material allows the opening reaching the auxiliary electrode 151 to be formed finely when used as the second partition 126, which also makes it possible to reduce the size of the opening. Therefore, in the case of a high definition display device, even when the distance between the pixels is short, the second partition 126 can be formed and the opening reaching the auxiliary electrode 151 can be formed finely.

Next, the layer containing an organic compound is formed over the first electrode 118, the first partition 124, and the second partition 126. The layer containing an organic compound can be fanned by evaporation (including vacuum evaporation) or the like.

The layer containing an organic compound is formed to be divided by the second partition 126. The layer 119 containing an organic compound over the auxiliary electrode 151, the layer 120 containing an organic compound over the first electrode 118, and the layer 121 containing an organic compound over the second partition 126 are divided from each other by the second partition 126. Only the layer 120 containing an organic compound and formed over the first electrode 118 functions as the light-emitting layer of the light-emitting element 130.

The layer 120 containing an organic compound and formed over the first electrode 118 may have a single-layer or a stacked-layer structure. Light emitted from the layer 120 containing an organic compound is preferably white, and light having a peak in each of red, green, and blue wavelength regions is preferable.

Next, the second electrode 122 is formed over the layers containing an organic compound. The second electrode 122 is not divided by the second partition 126 and is electrically connected to the auxiliary electrode 151.

As the second electrode 122, a metal film having a thickness less than or equal to 20 nm, preferably more than or equal to 15 nm and less than or equal to 20 nm is used. Typically, a MgAg film is used. Further, the MgAg film over which indium tin oxide (ITO), indium zinc oxide, or the like is stacked may be used as the second electrode.

Alternatively, as the second electrode 122, a conductive material film which has a light-transmitting property and includes at least a layer of graphene may be used; for example, a stack in which a layer of iron chloride ($FeCl_3$) is sandwiched between a plurality of layers of graphene, such as five layers of graphene each pair of which sandwiches a layer of iron chloride, can be used. The stack of the layers of graphene and the layer of iron chloride is a light-transmitting conductive film and has a light transmittance of higher than 80%.

Note that one of the first electrode 118 and the second electrode 122 functions as an anode of the light-emitting element, and the other functions as a cathode of the light-emitting element. It is preferable to use a substance having a high work function for the electrode which functions as an anode, and a substance having a low work function for the electrode which functions as a cathode.

Through the above steps, it is possible to faun the light-emitting element 130 and the transistor 150, which controls driving of the light-emitting element, over the same substrate.

In addition, a method for forming the second substrate 160 provided with the light-shielding films 164, the coloring layers 166 functioning as color filters, and an overcoat 168 is described below.

A second buffer layer 162 is formed over the second substrate 160. The second buffer layer 162 can be formed using a material and a method similar to those of the first buffer layer 104.

Next, a material film is formed over the second buffer layer 162, and a photolithography process and an etching step are performed thereon, whereby the light-shielding films 164 functioning as black matrixes are formed. For the light-shielding films 164, a low reflectance metal film such as a titanium film or a chromium film, or an organic resin film impregnated with black pigment or black dye can be used.

Next, the coloring layers 166 of several colors functioning as color filters are formed over the second buffer layer 162 and the light-shielding films 164. The coloring layers 166 are colored layers transmitting light in specific wavelength regions. For example, a red (R) coloring layer transmitting light of a red wavelength region, a green (G) coloring layer transmitting light of a green wavelength region, a blue (B) coloring layer transmitting light of a blue wavelength region, and the like can be used. Each coloring layer is formed in a desired position with a known material by printing, inkjet, etching using photolithography, or the like.

Although a method of using three colors of R, G, and B is described here, the present invention is not limited to this structure. A structure in which four colors of R, G, B, and Y (yellow) are used or a structure in which five or more colors are used may be employed.

Next, the overcoat 168 is formed over the light-shielding films 164 and the coloring layers 166.

An organic resin film formed of acrylic, polyimide, or the like can be used to form the overcoat 168. The overcoat 168 can prevent diffusion of an impurity component and the like contained in the coloring layers 166 to the light-emitting element side. The overcoat 168 may have a stacked-layer structure of an organic resin film and an inorganic insulating film. Silicon nitride, silicon oxide, or the like can be used for the inorganic insulating film. Note that the overcoat 168 is not necessarily provided.

Through the above steps, the second substrate 160 provided with the second buffer layer 162, the light-shielding films 164, the coloring layers 166, and the overcoat 168 is formed.

Next, the first substrate 100 and the second substrate 160 are aligned and bonded to each other using the first adhesive layer 170.

There is no particular limitation on the first adhesive layer 170, and a light-transmitting adhesive having high refractive index and capable of bonding the second electrode 122 provided over the first substrate 100 and the overcoat 168 provided over the second substrate 160 can be used. A substance having molecular size less than or equal to the wavelength of light and functioning as a dry agent (zeolite or the like), or a filler with a high refractive index (titanium oxide, zirconium, or the like) is preferably mixed to the adhesive because reliability or light-extraction efficiency of the light-emitting element 130 is improved.

Further, a sealing film with low moisture permeability may be formed between the first adhesive layer 170 and the second electrode 122. As the sealing film with low moisture permeability, for example, silicon oxide, silicon nitride, aluminum oxide, or the like can be used.

Through the above steps, an active matrix display device can be manufactured.

In the case of a display device including 2000 scan lines (considering 4k2k images with 4096×2160 pixels, 3840×2160 pixels, or the like), a row-selection period is 1/240000 second ($\approx 4.2$ μs) if signal delay or the like caused by a wiring is not taken into consideration.

Since the oxide semiconductor material is used for the semiconductor layer of the transistor and the auxiliary electrode 151 is formed, a high definition display device including 2000 or more scan lines can be provided.

Figure 3A:
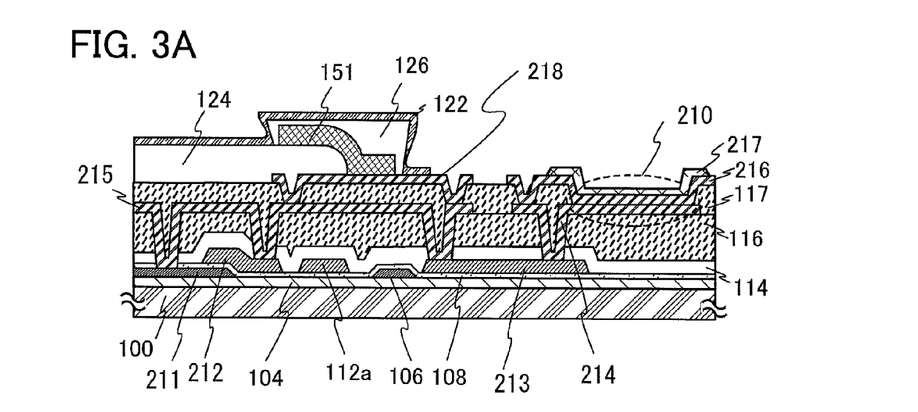
FIGS. 3A and 3B are a cross-sectional view of one embodiment of the present invention and a top view of a terminal portion.

When the auxiliary electrode 151 is provided, there are portions where the auxiliary electrode 151 intersects with the gate electrode and the source electrode. Further, when a display area is increased, electrical connection between the auxiliary electrode 151 and an electrode in a lower portion is preferably formed at a plurality of points to improve yield. The electrode in the lower portion can be formed in the same step as the gate electrode, the source electrode, or the connection electrode. FIG. 3A illustrates examples of a cross-sectional structure and a connection between electrodes of a terminal portion 210 including a terminal electrode 217 to which FPCs are attached.

Figure 3B:
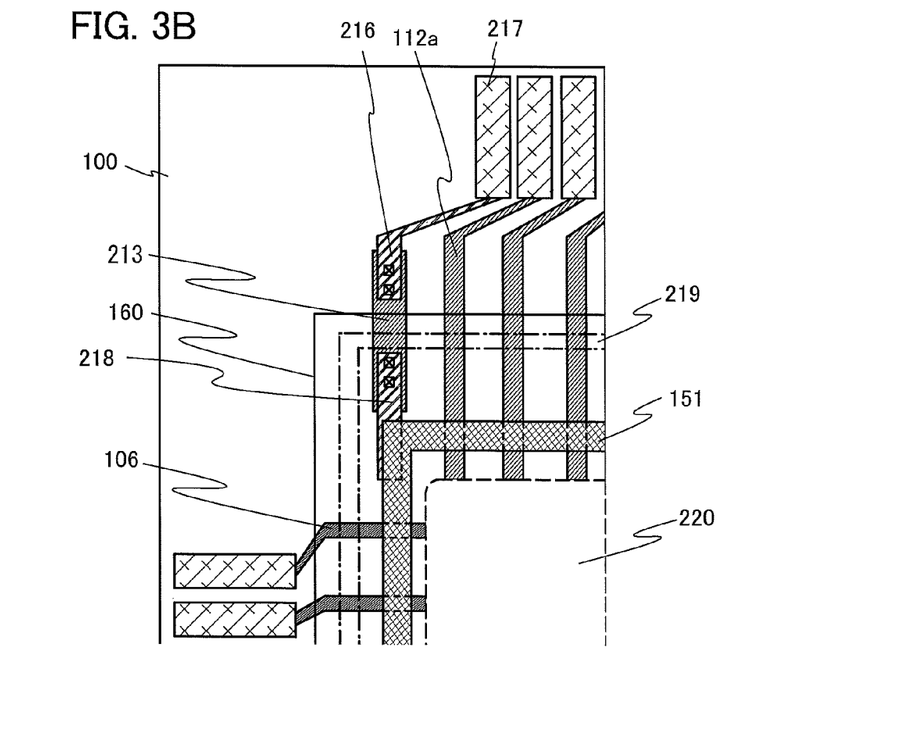

As illustrated in FIG. 3A, on the periphery of the terminal portion, the auxiliary electrode 151 can be electrically connected to wirings 216 and 218 for terminals which are formed in the same step as the first electrode 118. FIG. 3B is an enlarged top view of part of FIG. 2B, specifically a top view of the periphery of a portion where the FPCs 1505 and 1512 are attached to the terminal electrode. In the pixel portion, as illustrated in FIG. 1B, the auxiliary electrode 151 is in contact with the second electrode 122 and thus is connected to the second electrode 122; on the other hand, in a region outside the pixel portion, as illustrated in FIG. 3B, the auxiliary electrode 151 is electrically connected to the wiring 218 for a terminal which is formed in the same step as the first electrode 118 and thus is electrically connected to the second electrode 122 in contact with the wiring 218 for a terminal. In the pixel portion, to improve the aperture ratio, the auxiliary electrode 151 is in contact with the second electrode 122 and thus is connected to the second electrode 122, whereas in the region outside the pixel portion, to ensure electrical conduction, the auxiliary electrode 151 is connected so as to have a large contact area.

Further, as illustrated in FIG. 3B, the terminal electrode 217 is formed on an edge of the wiring 216 for a terminal and is electrically connected to the FPCs. The terminal electrode 217 is formed in such a manner that a conductive film of ITO or the like is formed by sputtering before the first partition 124 is formed and then, a photolithography process and an etching step are performed thereon. The conductive film of ITO or the like may be selectively formed over the first electrode 118 in the pixel portion, so that optical path lengths are adjusted, which improves color purity and luminance; for example, the conductive film is formed in the red pixel and is not formed in the blue pixel, so that they are different in an optical path length between the layer containing an organic compound and the first electrode.

A second adhesive layer 219 fixes the second substrate 160 to the third insulating layer 117 over the first substrate 100. The second adhesive layer 219 is shown by the dashed line in FIG. 3B. The second adhesive layer 219 has low adhesion to a metal material which composes the wirings and electrodes; therefore, as illustrated in FIG. 3B, the wirings 216 and 218 for terminals are electrically connected to each other through an electrode 213 so that the wirings do not overlap with the second adhesive layer 219 to be in contact with the second adhesive layer 219. Further, regions where the auxiliary electrode 151 is connected to the wiring 218 for a terminal are positioned to surround a pixel portion 220. Note that although not illustrated in FIG. 3B, the second electrode 122 is formed over the second partition 126 covering the auxiliary electrode 151 and the periphery of an edge of the second electrode 122 is provided between the auxiliary electrode 151 and the terminal electrode 217 when seen from above.

In addition, the wirings 216 and 218 for terminals are connected to the second electrode 122. The wirings 216 and 218 for terminals can be connected to electrodes 214 and 215 which are formed in the same step as the connection electrode at a plurality of points. The electrode 215 can also be connected to an electrode 211 formed in the same step as the gate electrode or an electrode 212 and the electrode 213 which are formed in the same step as the source electrode at a plurality of points. Further, a protective circuit in which an oxide semiconductor material is used may be provided between the terminal portion 210 and the pixel portion 220 if needed.

As described above, in the display device described in this embodiment, the oxide semiconductor material is used for the semiconductor layer of the transistor and the auxiliary electrode is provided between the adjacent light-emitting elements, which enables a large-area display. Further, in a top-emission EL display device, even the distance between the adjacent light-emitting elements is shortened, the auxiliary electrode can be provided between the adjacent light-emitting elements, which enables a high definition display.

Embodiment 2

A display device disclosed in this specification can be applied to a variety of electronic appliances (including game machines). Examples of the electronic appliances include a television device (also referred to as a television or a television receiver), a monitor of a computer, cameras such as a digital camera and a digital video camera, a digital photo frame, a mobile phone, a portable game machine, a portable information terminal, an audio reproducing device, a game machine (e.g., a pachinko machine or a slot machine), and a game machine console. Specific examples of the electronic appliances are illustrated in FIGS. 4A and 4B.

Figure 4A:
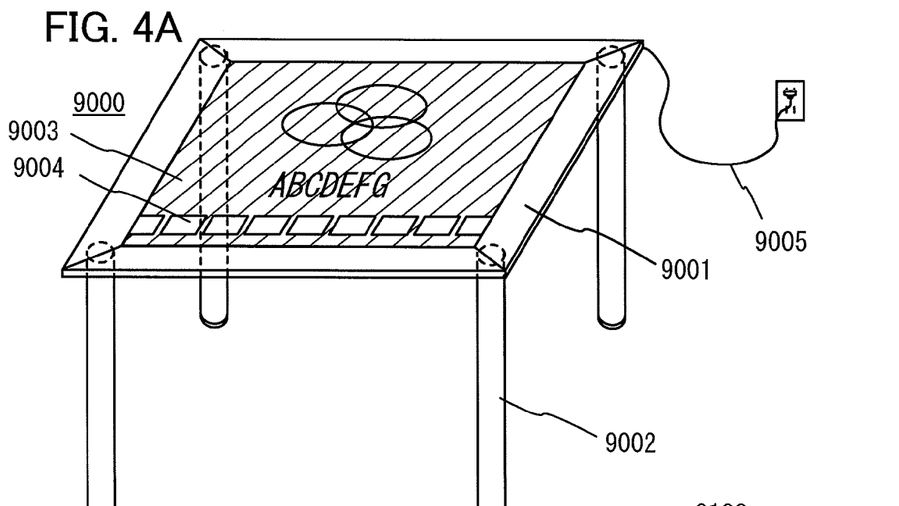
FIGS. 4A and 4B illustrate electronic appliances.
Figure 4B:
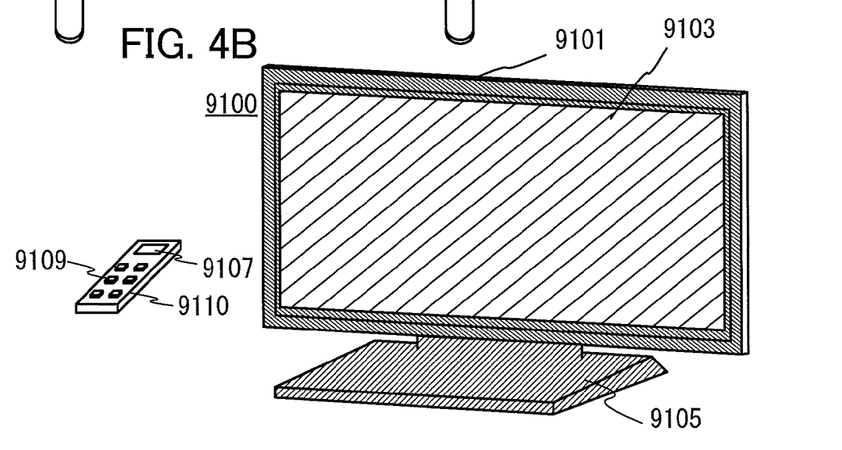

FIG. 4A illustrates a table 9000 having a display portion. In the table 9000, a display portion 9003 is incorporated in a housing 9001. A display device manufactured with the use of one embodiment of the present invention can be used for the display portion 9003, and an image can be displayed on the display portion 9003. Note that the housing 9001 is supported by four leg portions 9002. Further, a power cord 9005 for supplying power is provided for the housing 9001.

The display portion 9003 has a touch-input function. When a user touches displayed buttons 9004 displayed on the display portion 9003 of the table 9000 with his/her fingers or the like, the user can carry out operation of the screen and input of information. Further, when the table may be made to communicate with home appliances or control the home appliances, the display portion 9003 may function as a control device which controls the home appliances by operation on the screen.

Further, the screen of the display portion 9003 can be placed perpendicular to a floor with a hinge provided for the housing 9001; thus, the table 9000 can also be used as a television device. When a television device having a large screen is set in a small room, an open space is reduced; however, when a display portion is incorporated in a table, a space in the room can be efficiently used.

FIG. 4B illustrates a television device 9100. In the television device 9100, a display portion 9103 is incorporated in a housing 9101. A display device manufactured with the use of one embodiment of the present invention can be used in the display portion 9103, and an image can be displayed on the display portion 9103. Note that the housing 9101 is supported by a stand 9105 here.

The television device 9100 can be operated with an operation switch of the housing 9101 or a separate remote controller 9110. Channels and volume can be controlled with an operation key 9109 of the remote controller 9110 so that an image displayed on the display portion 9103 can be controlled. Furthermore, the remote controller 9110 may be provided with a display portion 9107 for displaying data output from the remote controller 9110.

The television device 9100 illustrated in FIG. 4B is provided with a receiver, a modem, and the like. With the receiver, the television device 9100 can receive a general television broadcast. Further, when the television device 9100 is connected to a communication network by wired or wireless connection via the modem, one-way (from a transmitter to a receiver) or two-way (between a transmitter and a receiver or between receivers) data communication can be performed.

With the use of the display device described in the above embodiment in the display portion 9103 of the television device, the television device can have a higher display quality than the conventional one.

This application is based on Japanese Patent Application serial No. 2012-108940 filed with Japan Patent Office on May 10, 2012, the entire contents of which are hereby incorporated by reference.

What is claimed is:

1. A display device comprising:
   a transistor over a substrate having an insulating surface;
   a first electrode electrically connected to the transistor;
   a first partition covering an edge of the first electrode;
   a conductive layer over the first partition;
   a second partition over the first partition, the second partition covering at least a side surface of the conductive layer;
   a light-emitting layer containing an organic compound over the first electrode; and
   a second electrode over the light-emitting layer.

2. The display device according to claim 1,
   wherein an edge of the light-emitting layer is covered with the second electrode, and
   wherein the second electrode is in contact with the first partition.

3. The display device according to claim 1, wherein the conductive layer is a film or a laminated film including an element selected from Ag, Mg, Cu, and Mo, an alloy material containing the element as a main component, or a compound material containing the element as a main component.

4. The display device according to claim 1, further comprising a coloring layer over the second electrode.

5. The display device according to claim 1, further comprising a light-shielding film over the second partition.

6. The display device according to claim 1, wherein a semiconductor layer of the transistor includes an oxide semiconductor material.

7. The display device according to claim 1, wherein the second electrode has a material that is the same as a material of the conductive layer.

8. The display device according to claim 1, further comprising a third electrode having a material that is the same as a material of the first electrode,
   wherein the third electrode is electrically connected to a terminal electrode,
   wherein the conductive layer is in contact with the third electrode, and
   wherein the second electrode is in contact with the third electrode.

9. The display device according to claim 1, wherein the second electrode has a light-transmitting property.

10. A display device comprising:
    a transistor over a substrate having an insulating surface;
    a first electrode electrically connected to the transistor;
    a first partition covering an edge of the first electrode;
    a conductive layer over the first partition;
    a second partition over the first partition, the second partition covering a side surface of the conductive layer;
    a light-emitting layer containing an organic compound over the first electrode; and
    a second electrode over the light-emitting layer,
    wherein the second partition has an opening reaching the conductive layer, and
    wherein the conductive layer is electrically connected to the second electrode through the opening.

11. The display device according to claim 10,
    wherein an edge of the light-emitting layer is covered with the second electrode, and
    wherein the second electrode is in contact with the first partition.

12. The display device according to claim 10, wherein the conductive layer is a film or a laminated film including an element selected from Ag, Mg, Cu, and Mo, an alloy material containing the element as a main component, or a compound material containing the element as a main component.

13. The display device according to claim 10, further comprising a coloring layer over the second electrode.

14. The display device according to claim 10, further comprising a light-shielding film over the second partition.

15. The display device according to claim 10, wherein a semiconductor layer of the transistor includes an oxide semiconductor material.

16. The display device according to claim 10, wherein the second electrode has a material that is the same as a material of the conductive layer.

17. The display device according to claim 10, further comprising a third electrode having a material that is the same as a material of the first electrode,
    wherein the third electrode is electrically connected to a terminal electrode,
    wherein the conductive layer is in contact with the third electrode, and
    wherein the second electrode is in contact with the third electrode.

18. The display device according to claim 10, wherein the second electrode has a light-transmitting property.

19. A semiconductor device comprising:
    a transistor over a substrate having an insulating surface;
    a first electrode electrically connected to the transistor;
    a first partition covering an edge of the first electrode;
    a conductive layer over the first partition;
    a second partition over the first partition, the second partition covering at least a side surface of the conductive layer;
    a light-emitting layer containing an organic compound over the first electrode;
    a second electrode over the light-emitting layer.

* * * * *